United States Patent [19]
Brodsky et al.

[11] Patent Number: 6,015,301
[45] Date of Patent: Jan. 18, 2000

[54] SURFACE MOUNT SOCKET

[75] Inventors: William Louis Brodsky, Binghamton; Benson Chan, Vestal; Glenn Edward Myrto, Binghamton; John Henry Sherman, Lisle, all of N.Y.

[73] Assignee: International Business Machines Corporation, Armonk, N.Y.

[21] Appl. No.: 09/121,452

[22] Filed: Jul. 23, 1998

Related U.S. Application Data

[62] Division of application No. 08/591,206, Jan. 17, 1996, Pat. No. 5,785,535.

[51] Int. Cl.[7] .................................................. H01R 9/09
[52] U.S. Cl. ............................................... 439/73; 439/331
[58] Field of Search ........................... 439/73, 76.1, 76.2, 439/330, 331, 342, 485, 487

[56] References Cited

U.S. PATENT DOCUMENTS

| | | | |
|---|---|---|---|
| 5,334,029 | 8/1994 | Akkapeddi et al. | 439/73 |
| 5,362,243 | 11/1994 | Huss et al. | 439/76.1 |
| 5,485,351 | 1/1996 | Hopfer et al. | 439/73 X |
| 5,602,719 | 2/1997 | Kinion | 439/73 X |
| 5,651,688 | 7/1997 | Lin | 439/331 |
| 5,785,535 | 7/1998 | Brodsky et al. | 439/73 |

*Primary Examiner*—Khiem Nguyen
*Attorney, Agent, or Firm*—Lawrence R. Fraley; John R. Pivnichny

[57] ABSTRACT

A surface mount socket having a capability to permit replacing a surface mount component. The component is biased with a spring toward an area array site on a substrate. The component and spring are positioned within a base adjacent the area array site and mechanically held down with a coupler. An interconnect structure for use therewith is provided.

6 Claims, 16 Drawing Sheets

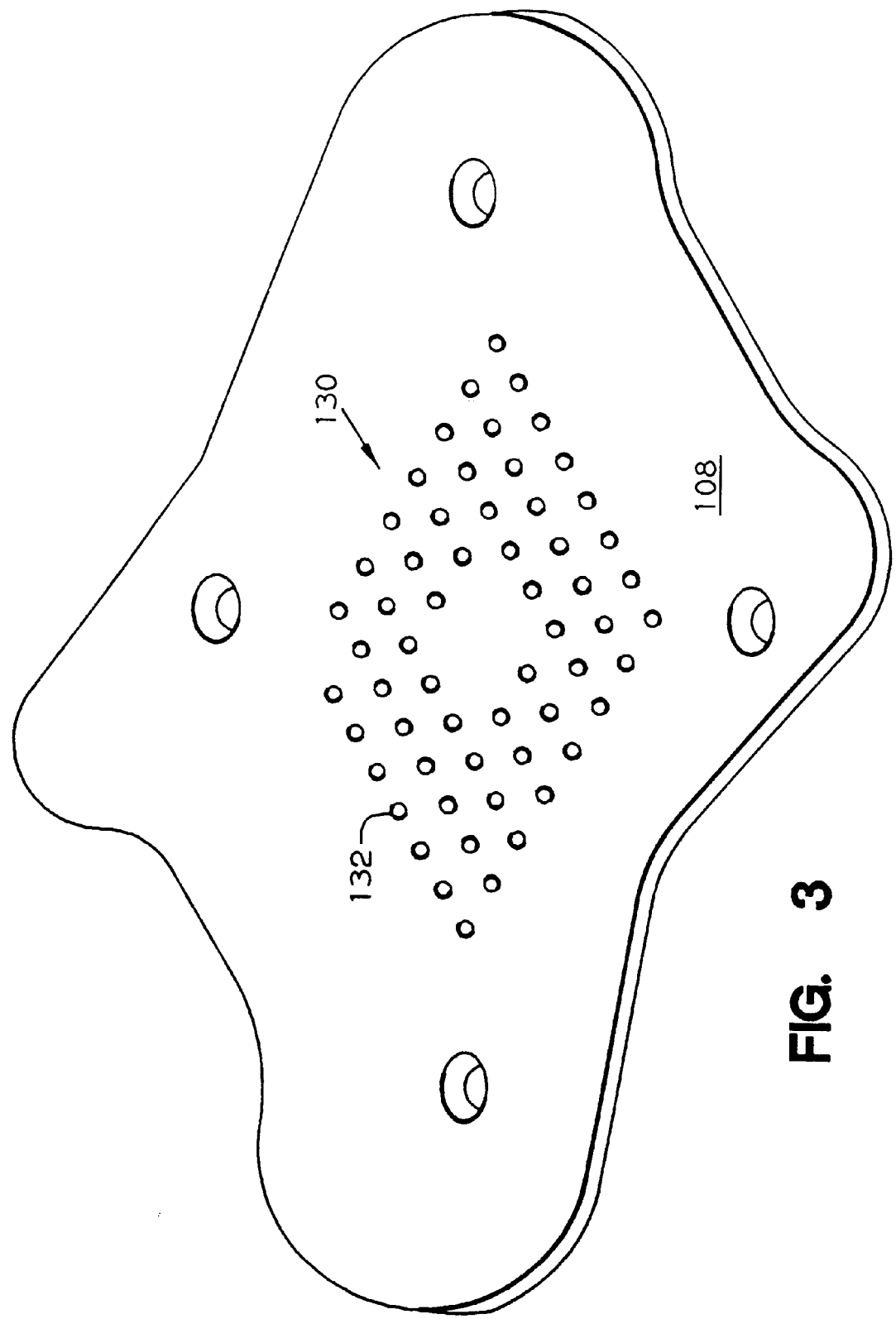

SURFACE MOUNT SOCKET

This is a division of Ser. No. 08/591,206 filed Jan. 17, 1996, now U.S. Pat. No. 5,785,535.

FIELD OF THE INVENTION

This application relates to computer systems with replaceable surface mount components and sockets for replaceable interconnection of surface mount components on a substrate.

BACKGROUND

Previously, most personal computer systems utilized circuit boards with components connected by a pin in hole PIH processes. Pins extending from PIH components were inserted into copper plated holes through the circuit board. The PIH components were permanently connected by moving the board over a molten wave of solder with the bottom of the board in contact with the wave so that solder was drawn up into the pin holes to form a metal joint. Also, most integrated chips came in dual in line package (DIP). Such packages were molded plastic containing a chip wire bonded to a lead base from which leads extended out of two longer opposite sides of the package and down in two rows on opposite elongate edges of the module. Empty sockets for PIH DIP packages were provided for adding additional memory chips and for more expensive, complex parts such as microprocessors.

More recently, the more advanced processors of the popular 80X86 family were usually provided in pin grid array (PGA) packages. PGA's were used because processor modules require more input/output connections than other common modules. Pins of a PGA extend from the flat, square bottom surface in a two dimensional array of four or more rows of pins. Although PGA components were also originally developed for mounting in through holes, it became popular to produce computer systems with connection assemblies such as zero insertion force ZIF sockets that allow PGA processor modules to be easily replaced. Such systems could be upgraded simply by replacing a module on the circuit board. For example, many 80486 based personal computer systems allowed the 80486 chip carrier to be replaced with a higher speed 80486 module or even specially made advanced modules. More recently new generations of central processing units are being introduced at an unprecedented rate and it has become popular to provide new generations of processors which are compatible with system boards of previous generations. This also provides a market for new processor modules as soon as they become available. For example, at the time of introduction common P6 modules were compatible with many mother boards originally designed for PENTIUM™ (PGA) modules.

Today circuit board manufacturers are moving toward surface mount (SM) technology in which component leads are soldered to pads on a surface of a circuit board. This allows higher density connection since connection pads can be spaced at closer centers than holes, and allows opposite sides of the circuit board to be utilized for components. One popular type of surface mount component for high input/output I/O modules is the quad flat pack.

U.S. Pat. Nos. 5,387,120 and 5,120,238 suggest connectors that allow easily replacing quad flat packs during testing/burn-in and alleges that such connectors may be useful for other types of packages. In these patents, the connector assembly "includes a latch plate pivotally connected to an end of the connector and a hook part pivotally connected to an opposite end of the cover or latch plate."

U.S. Pat. Nos. 4,699,593, 4,744,009 4,768,973, and 4,832,612 suggest an assembly to test a chip carrier (8) connected to flexible circuit (6). The flexible circuit is attached to protective carrier (2) with a hole in which the carrier loosely fits. An interposer (30) connected to substrate (40) has posts (38) over which the protective carrier fits. A bias means compresses contacts of the flexible circuit (6) against contacts (24) of the interposer during test and burn-in. In '973 the bias means is a retaining plate (70), in '009 and '612 the bias means is a pressure plate (42).

U.S. Pat. No. 5,397,245, 5,468,157 and 5,468,158 disclose interconnect system for burn-in testing to produce known good die KGD. '157 suggests a carrier assembly "includes a substrate (17) having a compliant membrane (20b), a plurality of contact bumps (24) containing oxide-penetrating particles on the top surface of the compliant membrane (20b), a fence (30) attached to the top surface of the compliant membrane (20b) for positioning the semiconductor device (21) so that the bond pads on the semiconductor device (21) are aligned with the contact bumps 24." The assembly also includes posts 29b, biasing means, biasing clip 36, and base 42. In '157 the biasing means is a pressure screw and in '158 biasing means is a rotary latch with rotary ramps and a coil spring 60. Oxide penetrating particles are suggested in U.S. Pat. No. 5,083,697.

U.S. Pat. No. 5,052,481 suggests various biasing springs between a cold plate and heat sink, holding a heat sink against the back of a flip chip.

U.S. Pat. Nos. 4,729,809 and 5,163,837 suggest anistropically conductive films and '837 suggests apparatus "to clamp the component (20) to the circuit (12) with the connecter sheet (30) therebetween.

"Process for Producing Palladium Structures" IBM Technical Disclosure Bulletin, Vol. 14, No 1A, June 1981, describes a process for producing dendrites. U.S. Pat. Nos. 4,328,286 and 5,185,073 describe electro-deposition of Pd dendrites. U.S. Pat. No. 5,358,906 describes a chip with bonding pads coated with dendrites. U.S. Pat. No. 5,313,097 describes a memory module with chip connection pads coated with dendrites onto which balls of a flip chip are pressed and then the chips are clamped in place by a heat sink. Anonymous, "New Products Test Interposer" Research Disclosure, January 1990, Number 309 (Denneth Mason Publications Ltd., England) describes a test interposer pads coated with dendrites. "Encapsulated Dendrite Electrical Interconnect for Surface Mount Applications" by P. Arrowsmith et al, IBM Technical Disclosure Bulletin, Vol.38, No 08, August 1995, suggests encapsulating the connection between a gull wing leaded component and dendrite coated connection pads on a printed circuit board. "Double-Sided, Replaceable, Dendrite-Plated Interposer for Connector Applications" by Frankeny et. al., IBM Technical Disclosure Bulletin, Vol. 37, No 10, October 1994, suggests plating the lands of plated through holes of an interposer. U.S. Pat. No. 5,420,520 suggests a "chip test fixture system has contacts corresponding to the contacts on the semiconductor chip."The carrier contacts of '520 have dendritic surfaces."

SUMMARY OF THE INVENTION

Applicants have invented a computer system for mechanical connection and simple replacement of surface mount, area array components. Within the enclosure of the computer system a circuit board is connected to provide power and communications with other internal components and with external devices. A mechanism is attached to a substrate, for biasing an area array component down onto the substrate to allow simple, reliable initial placement, field replacement, and upgradability of such component. In the attachment process of applicant's invention a base member is mounted on the substrate adjacent to the area array site and an anisotropically conductive interposer is applied on the site. Then an area array component is positioned at the site, a pressure distribution member is placed over the component and then a spring bail is clamped over the pressure distribution member.

The invention includes the configurations and methods of producing and using the interposer, configurations and process for producing and mounting the base member, processes for positioning the component, the configuration and process for producing the pressure distribution member and the configuration and process for producing the spring bail.

The invention also includes configurations of a process for producing heat sinks and the opening for the heat sink in the pressure base and spring bail so that a heat sink can be mounted directly on the component.

In this application the term "area array component" refers to a surface mount component such as a flip chip or ball grid array chip carrier or other component in which contacts for interconnection are arranged on the surface of a component substrate. The contacts may be copper lands of the wiring layer, solder covered pads, solder bumps such as C4 bumps, balls such as eutectic or high melting temperature spherical solder preforms, vertical solder columns, or other surface connectors. The term "processor" is not limited to microcomputers, microcontrollers, math coprocessors, but also includes other high I/O components such as application specific integrated components (ASIC) with relatively high I/O counts (e.g. over 100 contacts), also the term applies either to the die or to a carrier package including such die.

BRIEF DESCRIPTION OF THE DRAWINGS

FIG. 3 is a perspective view of a substrate with area array surface mounting area.

DETAILED DESCRIPTION OF EMBODIMENTS INCLUDING BEST MODE

Figure 1:
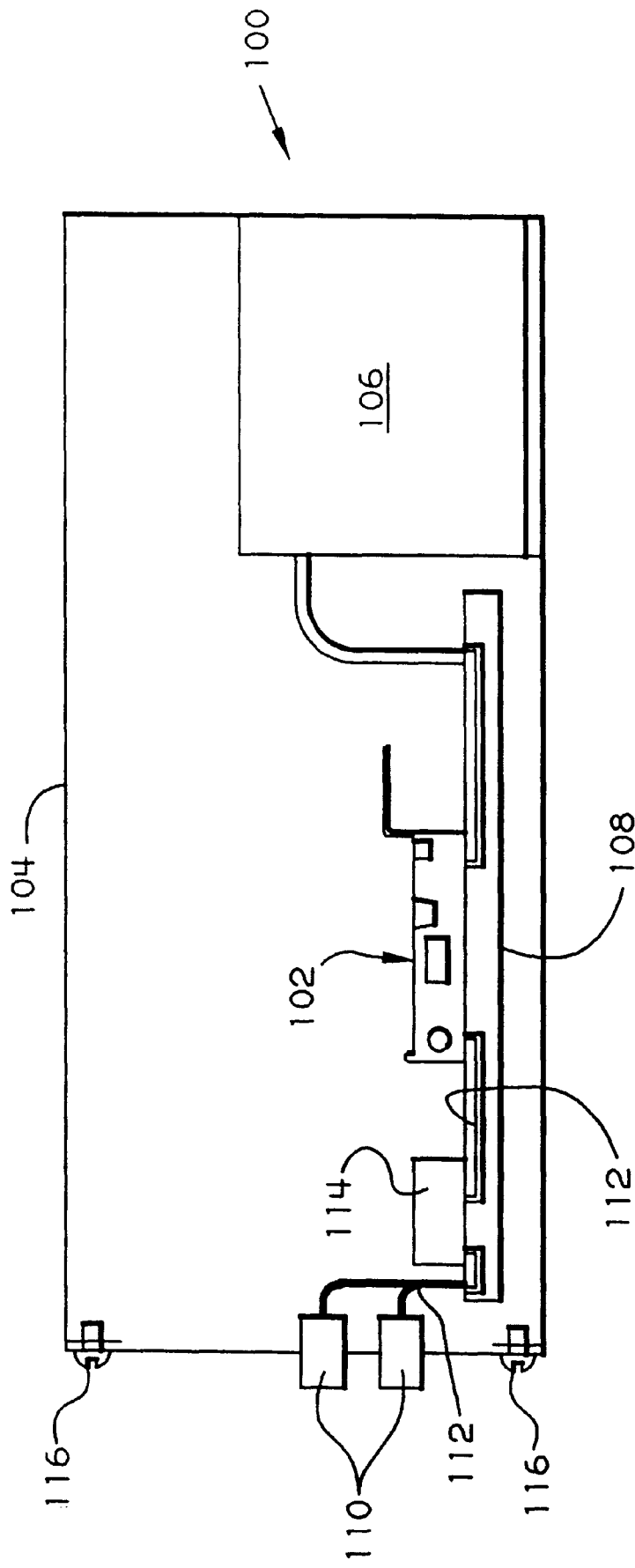
FIG. 1 is a layout of a computer system.

In FIG. 1 a computer system 100 of the invention provides a apparatus 102 described in detail below, for easily replacing an area array, surface mount component 120 in FIG. 2. The computer system may be a mainframe, personal computer, embedded machine controller or other system that utilizes integrated computer chips such as 122. Usually such systems include an enclosure 104 containing a power supply 106. The enclosure is usually a metal container to provide shielding. The power supply may be a battery or a transformer system to convert AC power to various DC potentials or may be a connector for connecting external DC power into the enclosure.

Figure 2:
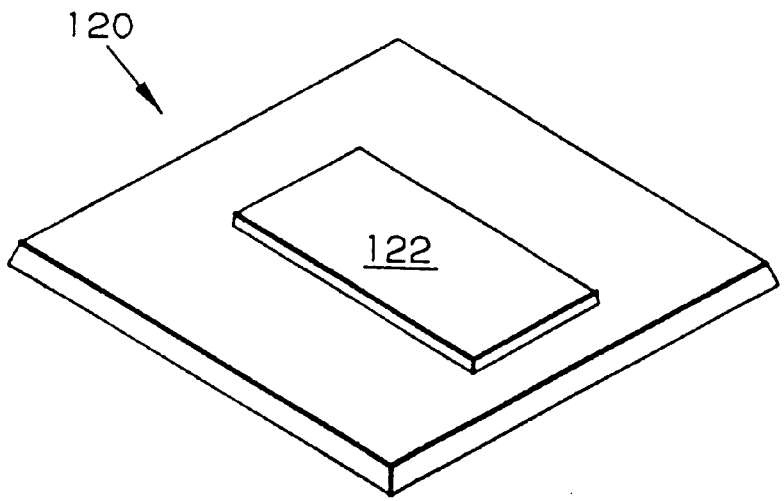
FIG. 2 is a perspective view of a area array surface mount component.

An interconnect substrate 108 is mounted in the enclosure, and has an attachment site 130 shown in FIG. 3 with an area array of metal contacts 132 for electrical connection to surface mount component 120 of FIG. 2. The substrate may include a ceramic or metal core circuit board or more preferably a circuit board with an organic core such as fiberglass filled epoxy. Ceramic circuit boards are commonly formed of one or more ceramic powders such as Alumina ($Al_2O_3$), Silicon Carbide and/or Beryllium Oxide blended with a binder and pressed to form green sheets which are printed with conducting inks, laminated together and cofired (sintered). Metal circuit boards are commonly aluminum covered with an organic dielectric layer on which copper wiring layers are deposited or more preferably, especially for direct chip attachment, the metal may be silicon or a metal with about the same thermal expansion coefficient as silicon such as CoFe (KOVAR™) or FeNi (INVAR™). Organic circuit boards are commonly FR-4 or G-10 produced by coating woven fiberglass cloth with epoxy, but they may include teflon, kevlar, or similar materials in place of or in addition to fiberglass, that are known in the art.

The area array of metal contacts on the substrate may be pads of a copper wiring layer on the surface of the substrate or more preferably the copper pad may be coated with a soft metal. Preferably the soft metal is gold or eutectic Sn/Pb solder. Solder may be deposited by dipping in molten solder which may be followed by hot air solder leveling (HASL), by printing and reflowing of solder paste, or by injection of molten solder. Also, gold or solder may be deposited by electoplating. The contacts may be flat or more preferably form hemispherical bumps. In addition to the following the corresponding area array of the components may include balls of high melting temperature metal such as copper or high lead solder.

Area array component components include several IBM products such as any Tape Ball Grid Array (TBGA) components, Ceramic Ball Grid array (CBGA) components, Ceramic Column Grid Array (CCGA), Plastic Ball Grid Array (PBGA) Components, Direct Chip Attach Modules (DCAM). Although the connectors of such components often have a regular grid pattern, the central region of the pattern is often not included or selected contacts are left out and this invention contemplates patterns of contacts that are not regular at all. C4 connection on flip chips and the balls mounted on Ball Grid Array components and the columns of Column Grid Array components are usually high melting temperature 90/10 Pb/Sn solder, but lower melting materials such as eutectic Pb/Sn solder or gold may be deposited on the balls. Also such high melt solder may be replaced by a thin coating or bump of softer material such as conductive adhesive, eutectic solder Pb/Sn solder or gold deposited on the copper pads to define the contacts of the components.

Connectors or connections 110 in FIG. 1 provide for communication with units that are external to the enclosure such as monitors, keyboards, modems, networks, printers, or controlled equipment. A bus 112 provides for communication between components of the computer system within the enclosure including signals between interconnect substrates 108, memory units 114, and the connectors 110.

Figure 4:
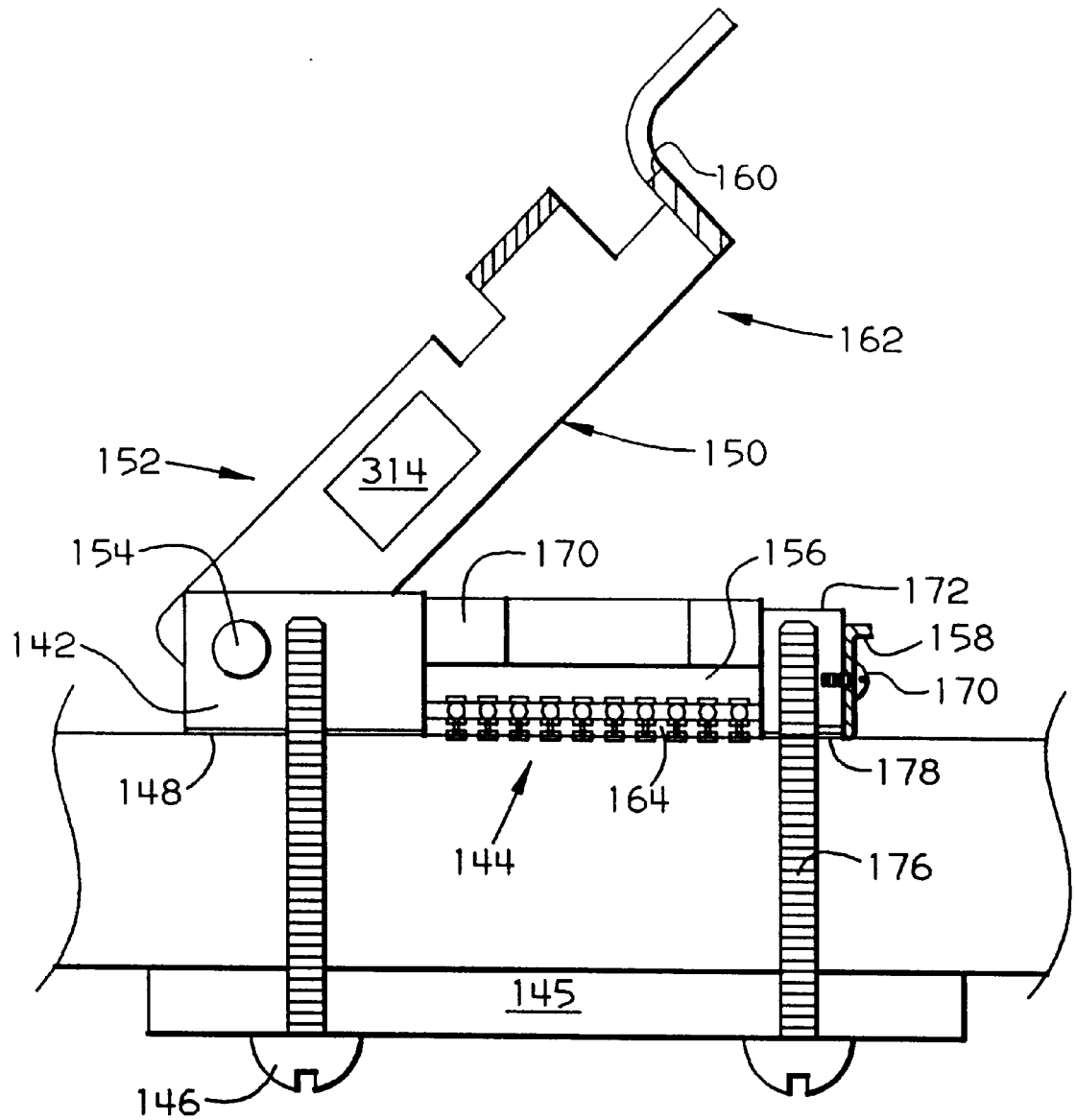
FIG. 4 is a cross-sectional view of surface mount socket including area array surface mount component.
Figure 11:
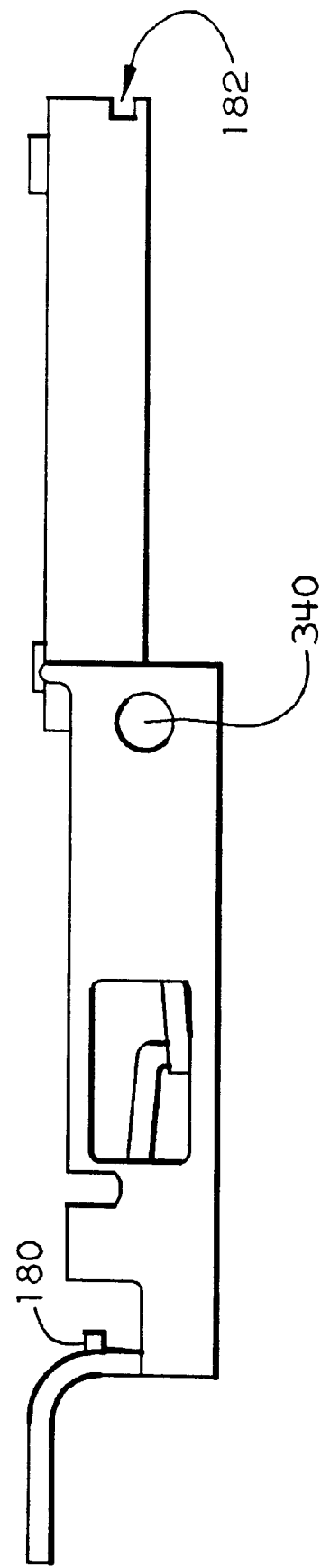
FIG. 11 is a side view of socket assembly showing spring bail and base.

In FIG. 4 a first base portion 142 is positioned adjacent to component attachment site 144 allowing access to the site. Preferably the base is a frame of metal or more preferably a molded organic material that may be subject to subsequent machining. Further details of the base will be discussed below. A backer plate 145 may be placed on the opposite side of the substrate from the frame to add any required stiffness. A backer plate is especially beneficial to flexible circuit boards which are a lamination of alternating patterned copper foils and organic dielectric film (e.g. polyamide) with conductive vias extending through any internal dielectric film layers. The base is connected to the substrate using threaded screws 146, another coupler such as epoxy adhesive 148, or other known methods. A spring bail 150 has a first end 152 hinged to the first base portion 142. The bail may be hinged using a pin 154 inserted through aligned holes in the spring bail and first portion of the base. The spring bail hinges to close over the area array site as shown in FIG. 1 for biasing an area array component 156 toward the area array site during operation. A latch 158 automatically mechanically couples to ledge 160 of a second end 162 of the spring bail when the bail is pushed down sufficiently onto the base and holds the spring bail down. The latch may be selectively uncoupled or broken to allow replacing the area array component and reusing the first base portion and spring bail. The mechanical coupler may be a pin or spotweld which would have to be broken or cut for in order to open the bail, but preferably the coupler is a mechanical interference system such as a latch or catch which may be easily released. The catch in this embodiment consists of a bent metal plate. Screw 170 connects catch 158 onto a second portion 172 of the base by mechanical interference. Alternately the plate may be bent to trap the plate onto the second portion of the base by mechanical interference. The second portion of the base is on the other side of the area array attachment site from the first portion of the base. The second portion of the base is connected to the substrate by screws 176 and/or by other coupling means such as adhesive 178. Another catch embodiment is shown in FIG. 11 in which a lip 180 of the spring bail inserts into a slot 182 in the spring bail to hold the spring bail closed.

Screws 116 in FIG. 1 allow opening the enclosure for accessing the apparatus 102 for replacing the area array component.

Preferably, the system further comprises an anisotropic electrically conductive interposer 164 in FIG. 4, by example a IBM FLEXIPOSER™ Connector by IBM, positioned across area array site 144. Interposer 164 is shown in isolation in FIG. 5. Preferably the interposer is connected to the base to simplify initial assembly and is reusable for replacing area array components. The interposer embodiment 200 shown in FIG. 6 includes a thin organic substrate 202 with through holes 204, which is plated with a metal such as copper 206 to form lands around the holes and plate the interior of the holes to make them conducting. On the copper sharp metal needle-like dendrites 207 such as palladium dendrites, are formed. Layers 208, 210 of soft metals such as eutectic Pb/Sn solder, gold, solder balls, or solder columns are respectively deposited onto copper pads 212, 214 respectively of the substrate 216 and area array component 218.

Figure 6:
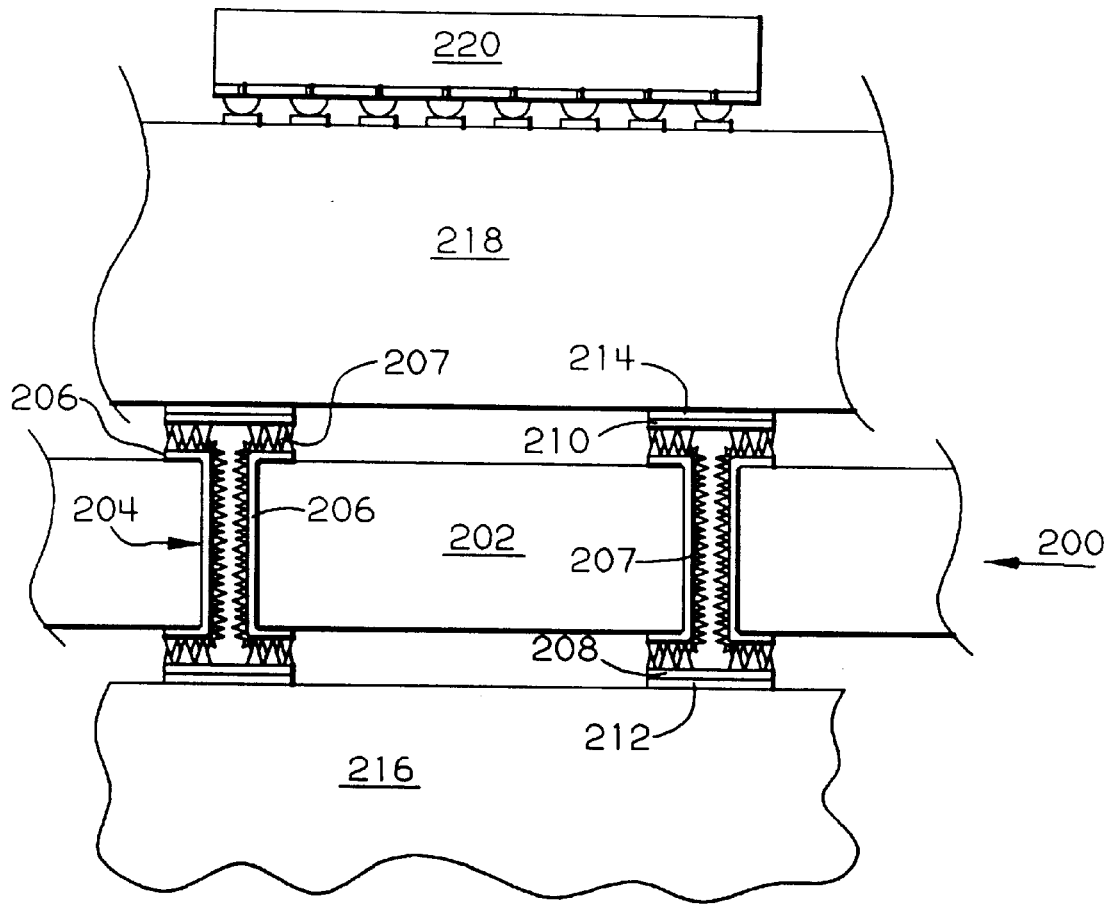
FIG. 6 is a cross-sectional view of an area array connection system, with the section taken through the interposers plated thru holes.
Figure 7:
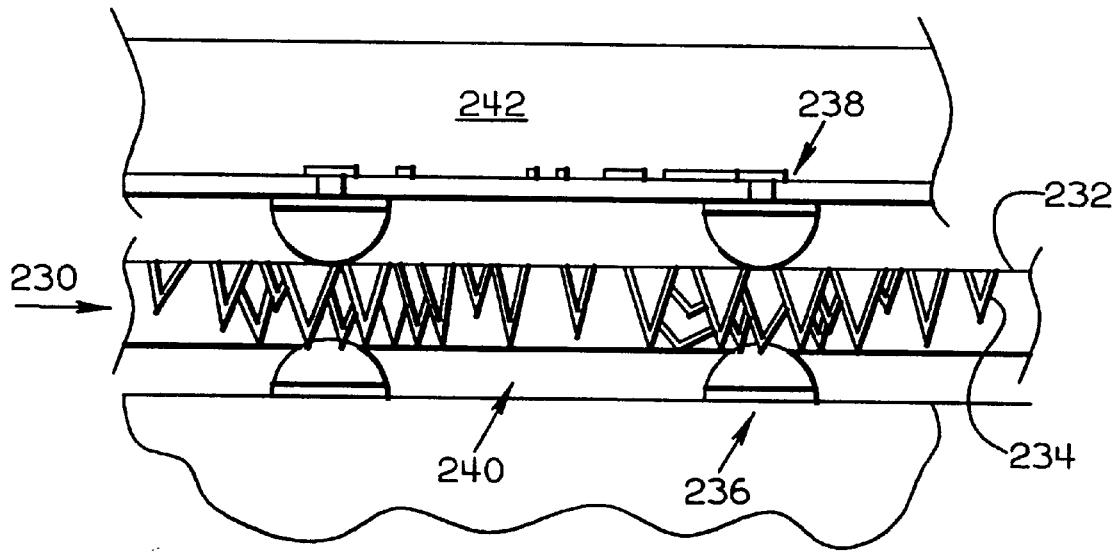
FIG. 7 is a side view depicting dendrite to contact interface.

The interposer embodiment 230 shown in FIG. 7 comprises a film of dendrite filled organic material 232. Such a film may be produced by forming dendrites 234 on a plate, depositing polyamide, silicone, or epoxy over the dendrites and removing the plate such as by etching away the plate material. Preferably in this embodiment the number of dendrites is maximized but limited by the requirement that connections remain electrically isolated. Preferably there is a higher concentration of dendrites between the confronting contacts 236, 238 than in the region 240 separating such pairs of contacts. The dendritic interposers 200 in FIG. 6 and 230 in FIG. 7 require a minimum average force of about 10 grams per connection for reliable operation and preferably 20 grams and most preferably at least 30 grams is provided for reliable operation. Preferably, the average force per contact is sufficiently low so that the contacts such as gold bumps do not significantly creep during operation. Preferably, the material of the interposer is sufficiently flexible so that the contact force between all the pairs of opposing contacts is sufficient to retain reliable connection during operation regardless of tolerances in the planarity of the arrays of contacts.

In FIG. 6 the area array component 218 is a module with integrated computer chip 220. In FIG. 7 the area array component is a flip chip 242. In these embodiments the contacts of the area array component are in positions corresponding to contact positions on the attachment site over which the spring bail is closed.

Figure 8:
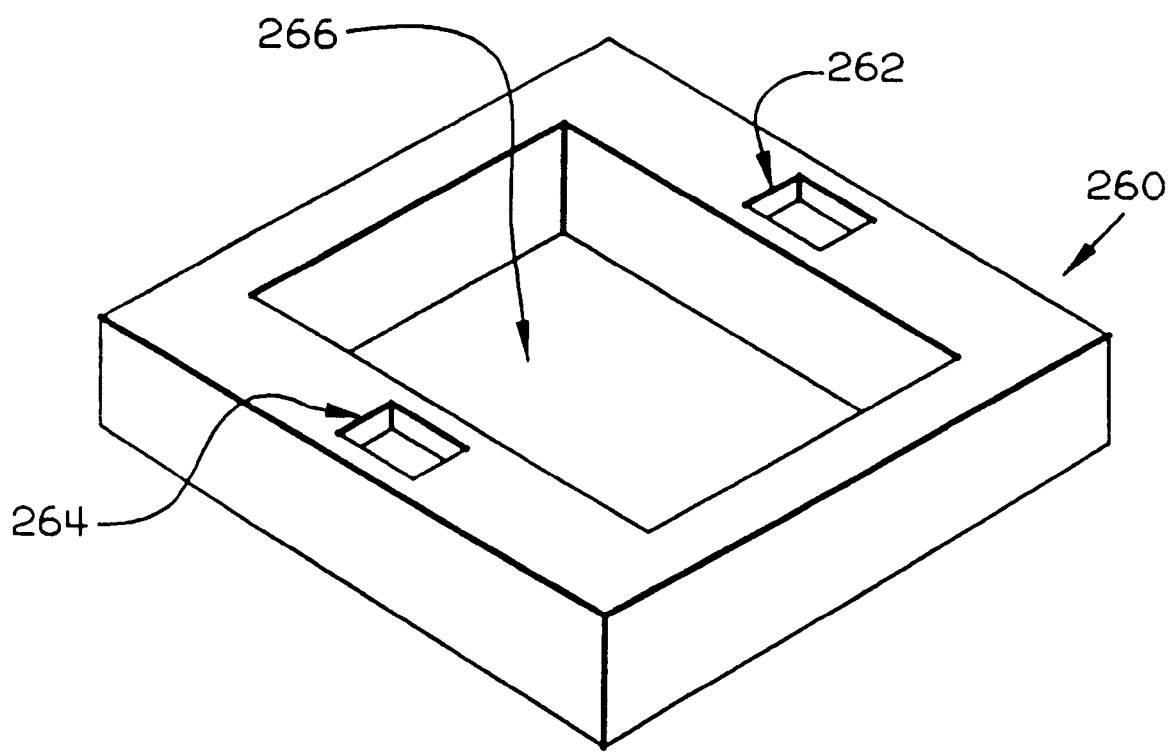
FIG. 8 is a perspective view of pressure distribution member.

The apparatus 102 in FIG. 1 further comprises a pressure distribution member 170 in FIG. 4, for distributing force from the spring bail evenly across an area array component to evenly compress the contacts at the site. In FIG. 8, a simple embodiment of the pressure distribution member 260 is shown with cavities 262, 264 into which fit the ends 302,304 of spring arms 306, 308 in FIG. 9. The distribution member shown in FIG. 8 has a rectangular central opening 266 which defines a heat sink attachment site on the surface of the component.

Figure 9:
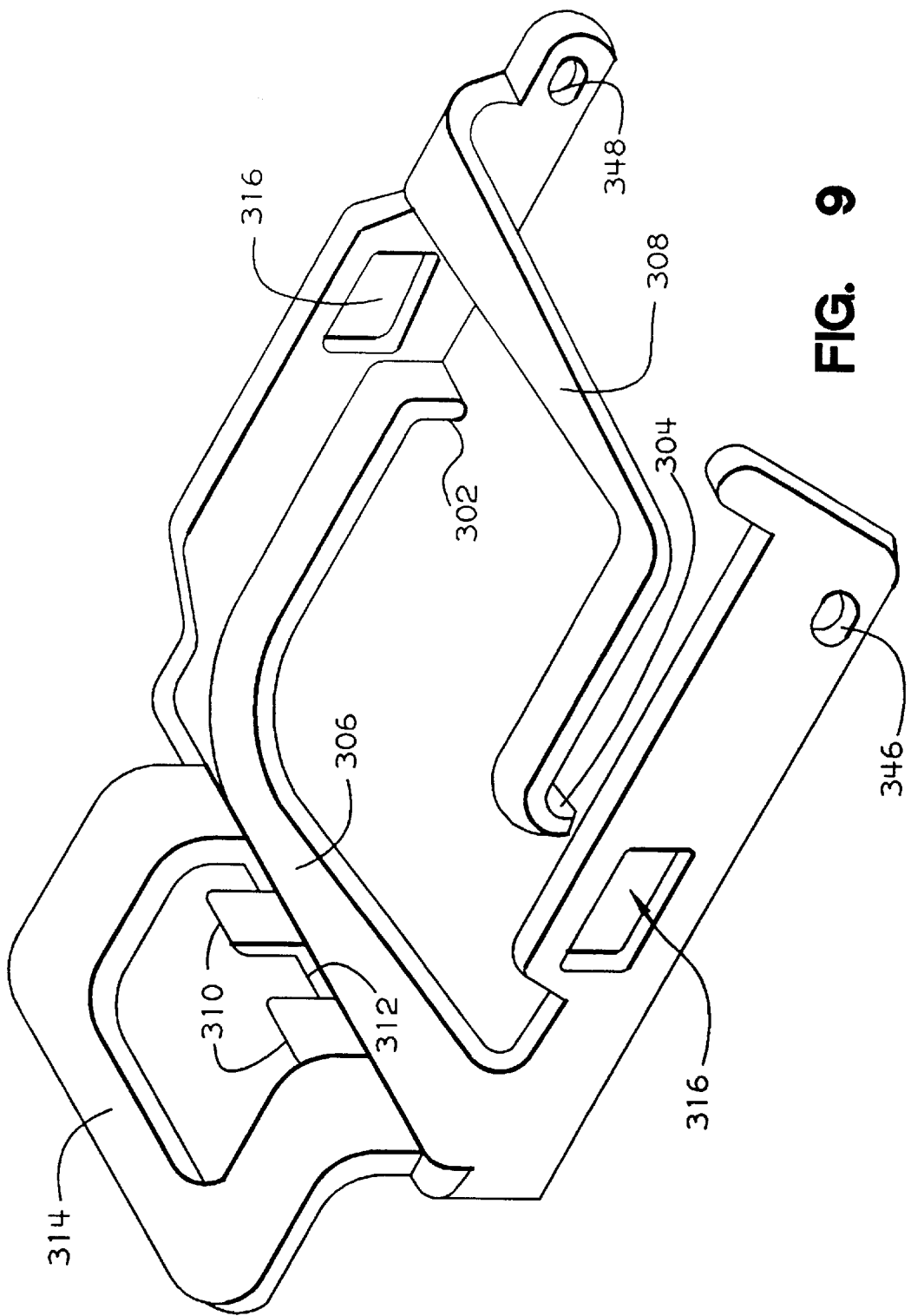
FIG. 9 is a perspective view of a spring bail.
Figure 10:
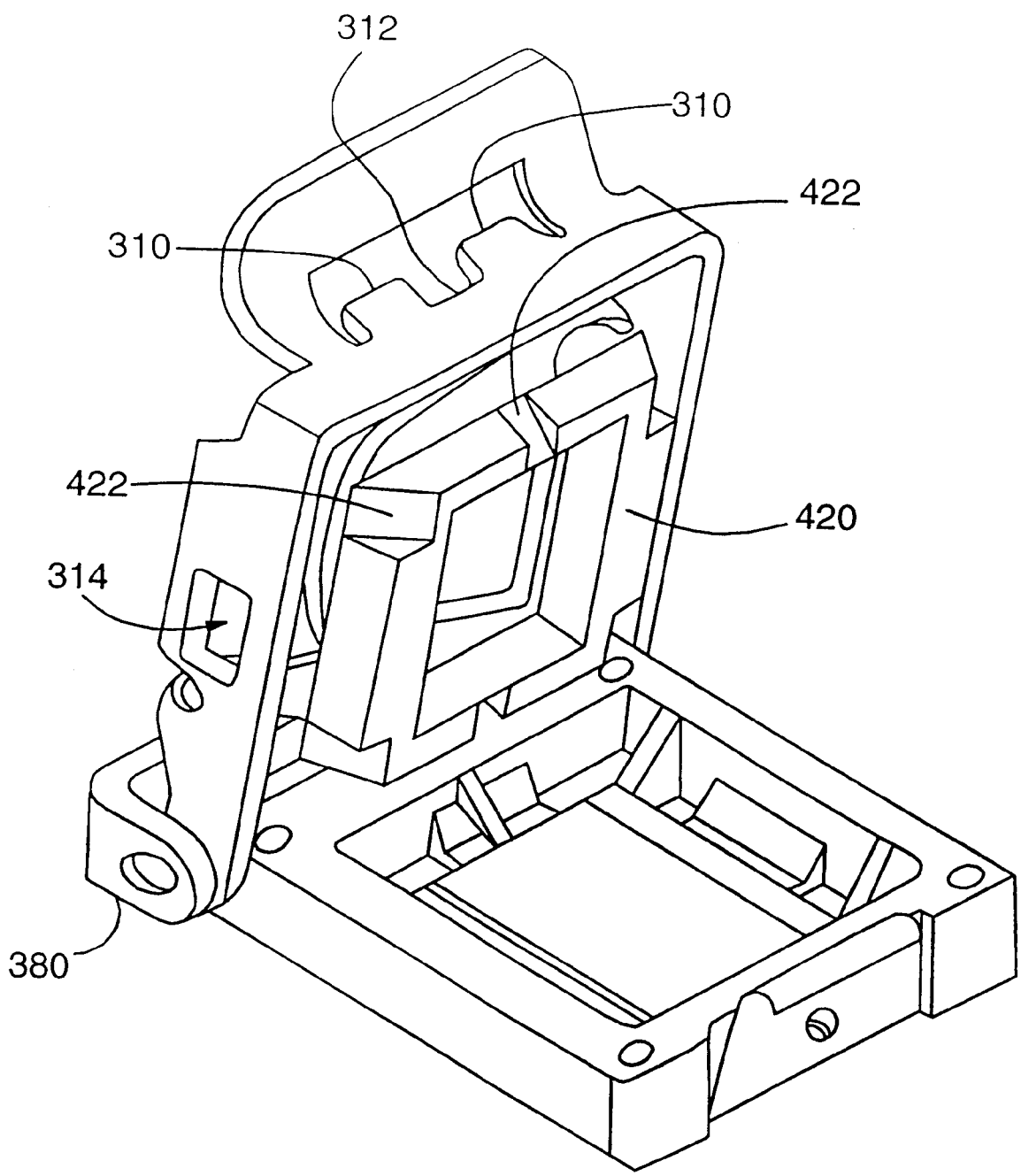
FIG. 10 is a perspective view of socket assembly.

FIGS. 9–14 show various embodiments of the spring bail of the invention. The material of the spring bail is a non-corrosive spring metal such as Phosphor Bronze, Beryllium Copper or most Preferably rolled stainless steel such as 0.062 inch thick 17-7 PH stainless steel. Preferably the bail is formed by stamping which results in a microstructure and other structural indication of such forming method. FIG. 10 most clearly shows both the ledge 310 to which the catch latches and a slot or recess 312 into which a screwdriver may be inserted and manipulated for releasing the catch.

Figure 15:
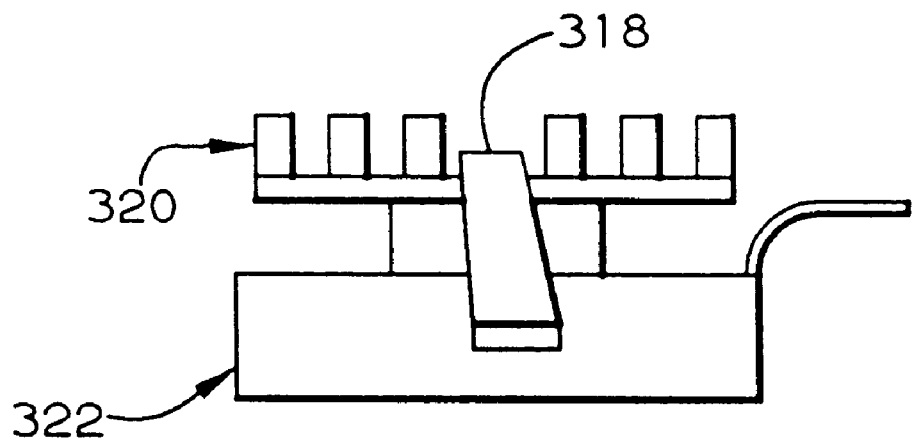
FIG. 15 shows a method for attaching the heat sink to the socket.
Figure 16:
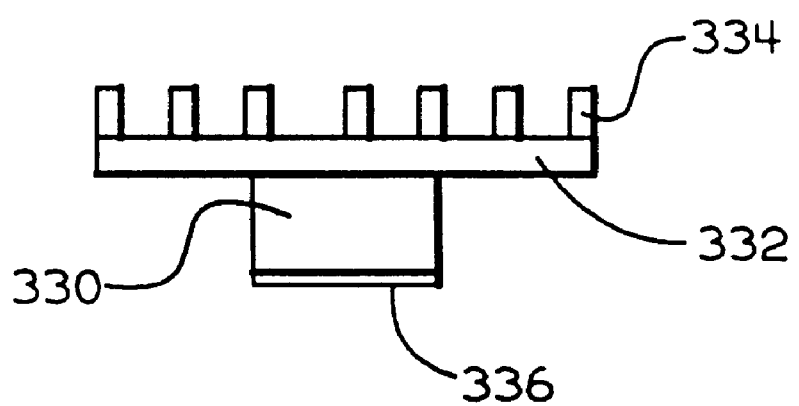
FIG. 16 shows a heat sink in it's preffered embodiment.

The spring bail preferably includes a thumb pad 314 in FIG. 9 at the second end of the bail for pushing the bail down to bias a component against the attachment site and pulling the bail open to allow additional access to the area array site. In the embodiments of FIGS. 9–12 the thumb pad is formed by bending the top portion of a vertical wall of the central member of the bail to form a curved upper lip. The bail also preferably includes holes 316 in FIG. 9 to provide an engagement ledge in the central portion of each respective arm member for engaging a spring clip 318 in FIG. 15 for clipping a heat sink 320 to bail 322 so that the bottom of the heat sink is biased into intimate contact with the top surface of the component during operation. An isolated heat sink is shown in FIG. 16 with a pedestal 330, a plate or base 332, and fins or pins 334. The materials of the heat sink may be any material that is highly thermally conductive and Preferably non-corroding. Preferably, the heat sink aluminum, or copper. More Preferably the aluminum is coated with anodizing or the copper is coated with Chromate conversion to prevent any oxidation. The plate and pedestal of the heat sink may be machined from a block or connected together by welding or with thermally conductive adhesives, or a finned heat sink may be extruded of aluminum and sliced up to form the heat sinks. Preferably a layer of material 336 is provided to thermally or thermally and mechanically connect the heat sink to the component. The material 336 may be a thermally highly conductive grease or a metal filled adhesive such as flexible epoxy or silicone to supplement the action of the clip or replace the clip in maintaining a tight joint for thermal conductance.

Figure 12:
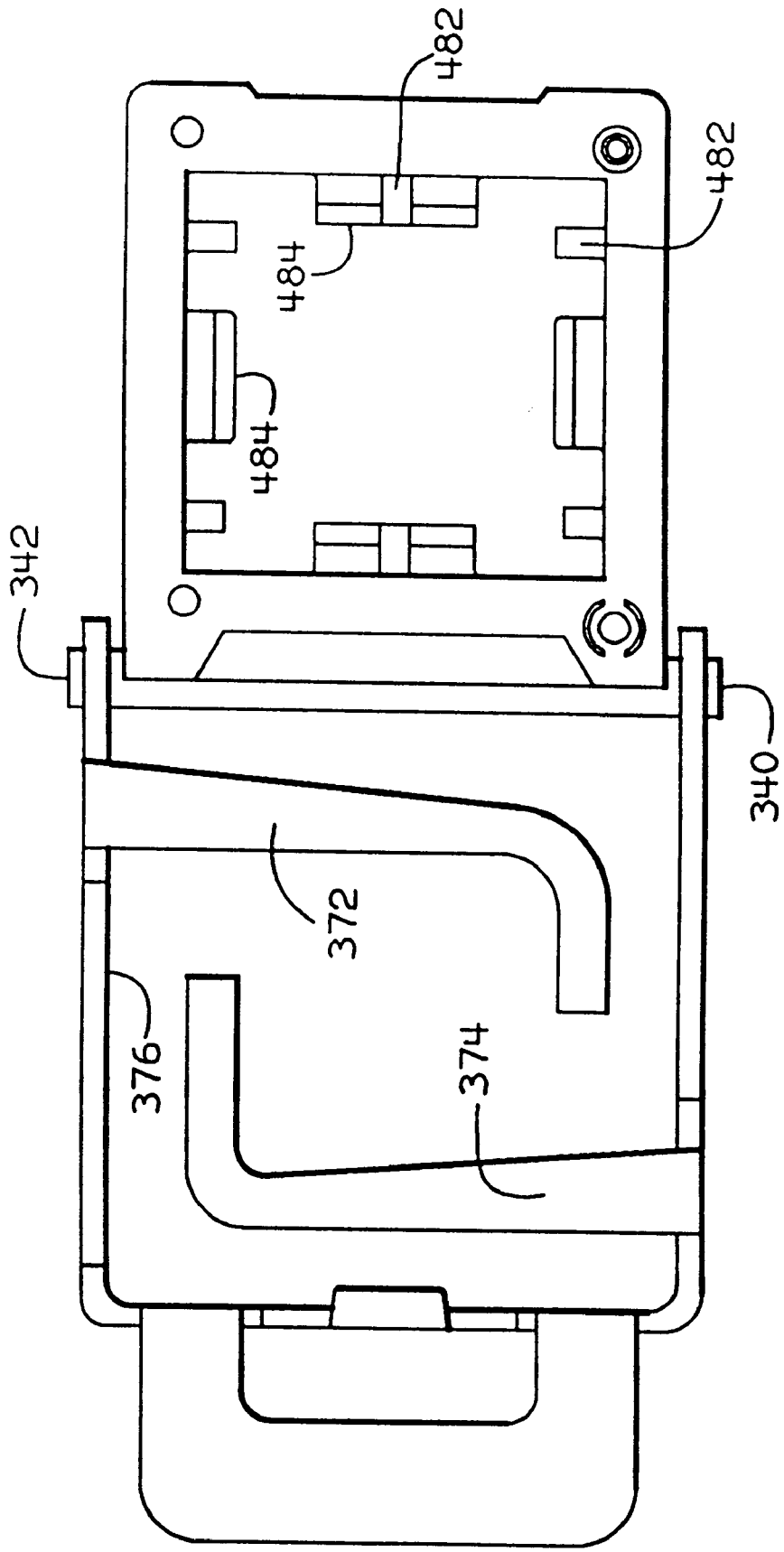
FIG. 12 is a top view of socket showing spring bail and base.
Figure 13:
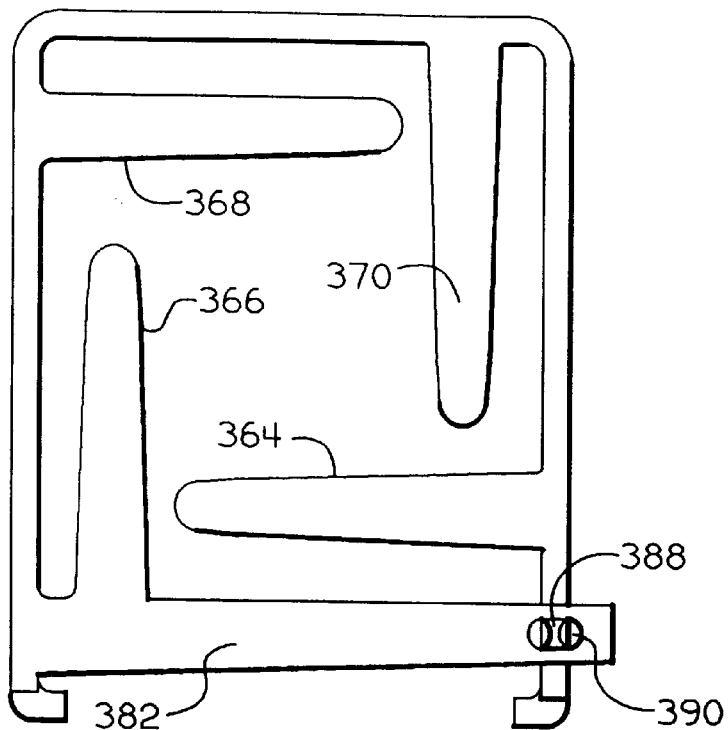
FIG. 13 is a top view of alternate embodiment of spring bail with integrated torsional arresting member.
Figure 17:
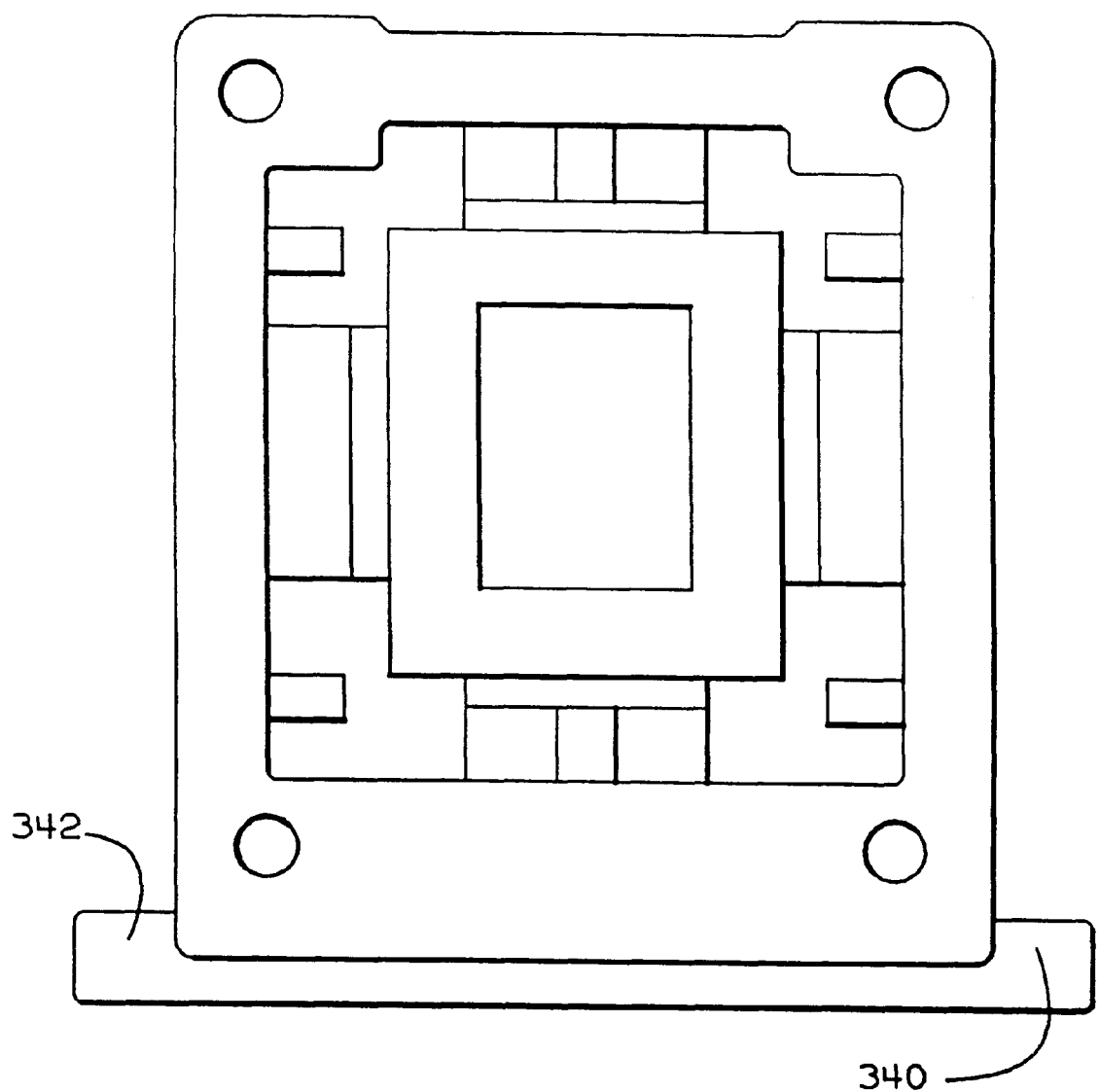
FIG. 17 shows the top view of the base member.
Figure 18:
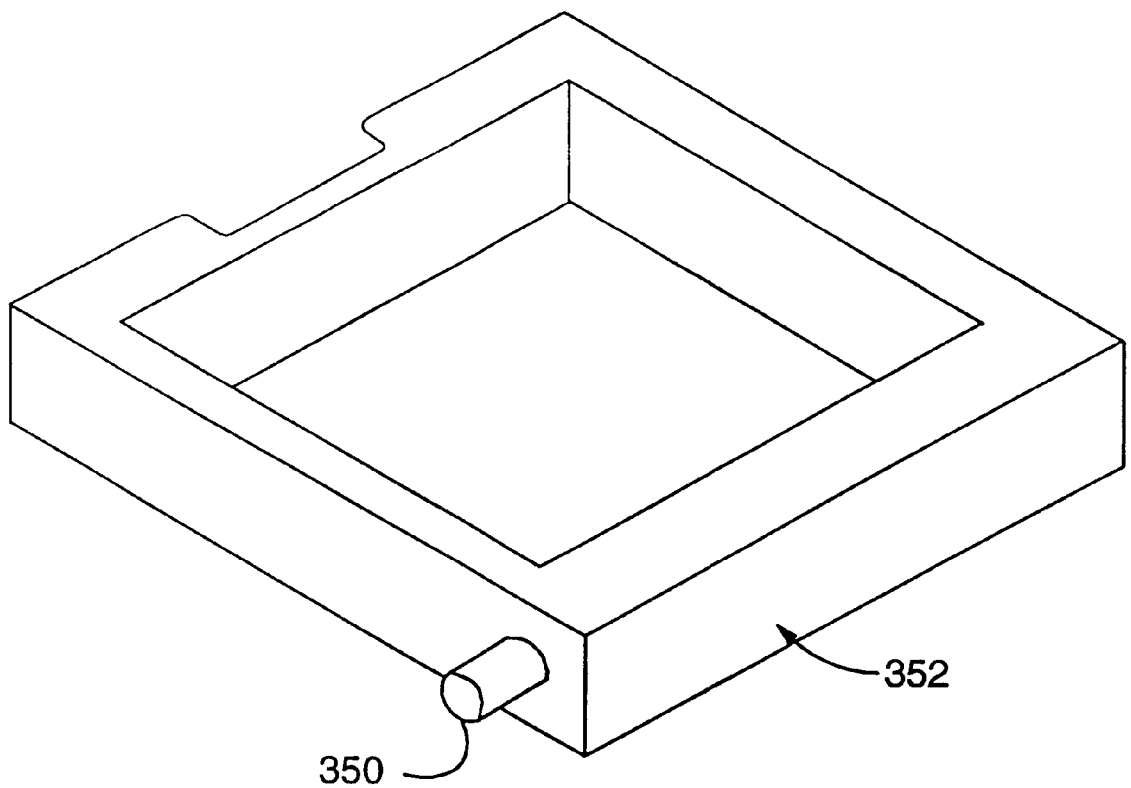
FIG. 18 is a perspective view of the base with a pin member for a hinge.
Figure 19:
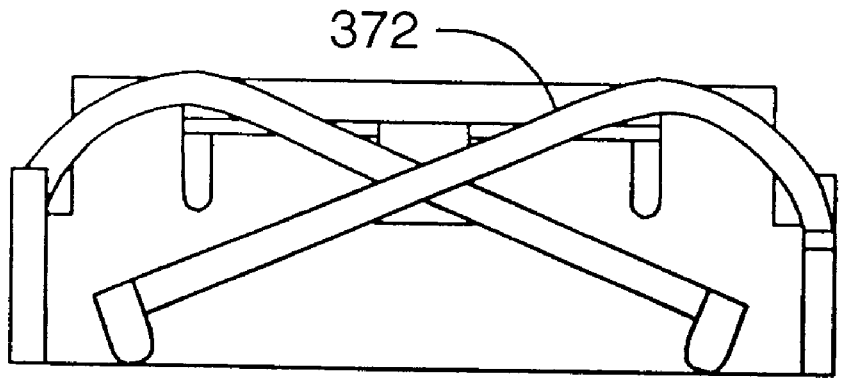
FIG. 19 is a rear view of the spring bail showing the downset of the tarantula arms.

The hinged connection between bail 150 and first portion 142 of the base (in FIG. 4) is described above. FIGS. 12, and 17 show another embodiment in which a projection 340, 342 of the first portion of the bail extends outward through the holes 346, 348 (best seen in FIG. 9) in the arm members of the bail to form a hinge joint. FIG. 18 shows an embodiment in which pin 350 extends through a hole in the first portion 352 and extends out of each side of the base to hinge both arm members of the spring bail. FIG. 13 shows another embodiment in which the second ends of arm members are bent inward for insertion into holes in the first portion of the base. Finally, FIG. 14 shows an embodiment in which pins 356, 358 are force fit into the holes in the arm members of the bail for extending into holes in the first portion of the base.

Figure 14:
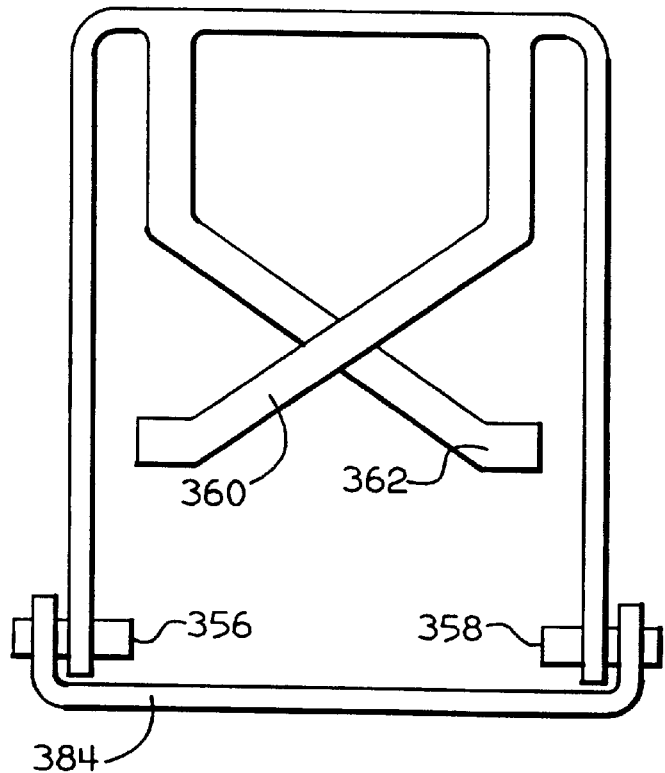
FIG. 14 is a top view of alternate embodiment of spring bail and torsional arresting member.
Figure 20:
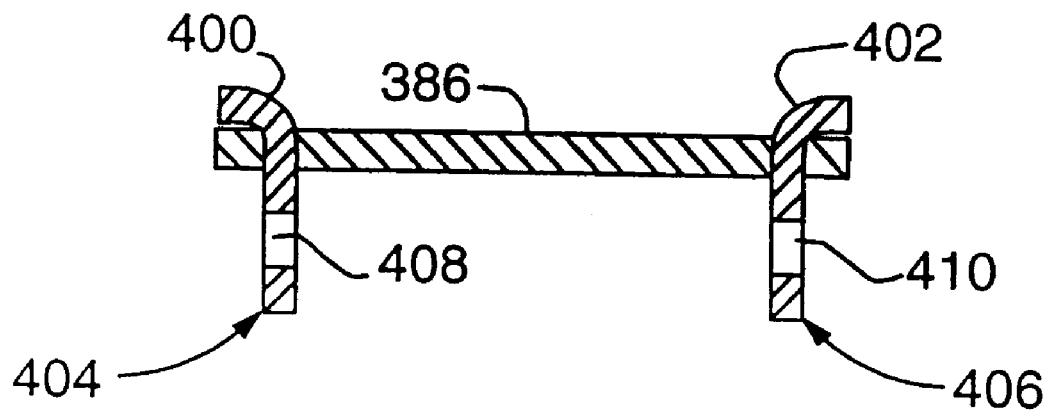
FIG. 20 is a section view of the spring bail and a method for implementing the torsion arresting member.

In FIGS. 9, 12 and 14 the spring arms are in a so called tarantula extend perpendicular 9 and 12 two spring arms extend perpendicular to the arm members of the bail frame and then further extend 90 degrees clock wise to about the center of the pressure distribution member. In FIG. 14 the spring arms extend at different heights and spring arm 360 crosses over the top of spring arm 362. In FIG. 13, the four spring arms 364, 366, 368, 370 extend as simple cantilevers. Spring arms 308 in FIG. 9, 372 in FIG. 12, and 364 in FIG. 13 extend from the second ends of arm members, near the hinge points. In order to prevent twisting such arm members, torsion arresting members 380 in FIG. 10, 382 in FIG. 13, or 386 in FIG. 20 may be provided. In FIG. 13 the torsion arresting member extends integrally from the second end of one arm member to a tab 388 extending from the second end of the other arm member and through a hole (not shown) in the torsion arresting member where weld 390 mechanically connects the tab to the other arm member to form a rigid frame. In FIG. 20, the torsion arresting member 386 is held mechanically fixed by tabs 400, 402 bent over as shown, which extend respectively from arm members 404, 406 near through holes 408, 410.

In a second embodiment, base frame 420 in FIGS. 10, 12 and 17 includes incline ramps 482 for course guidance of the component and pressure plate, and includes accurate edge guides 484 for positioning the area array component. Preferably the fit is sufficiently snug to position the component within about 1 mil with respect to the base. The pressure distribution member 420 in FIG. 10 is a different embodiment from the pressure distribution member 170 of FIGS. 4 and 8 described above. Pressure distribution member 420 includes inclines 422 which fit the incline ramps of the base of FIGS. 10, 12 and 17. The spring rate of the spring arms in combination with the thickness of the pressure distribution member determines the force applied to the component. The thickness of the pressure distribution member can be adjusted to compensate for tolerances in the thickness of components.

Figure 5:
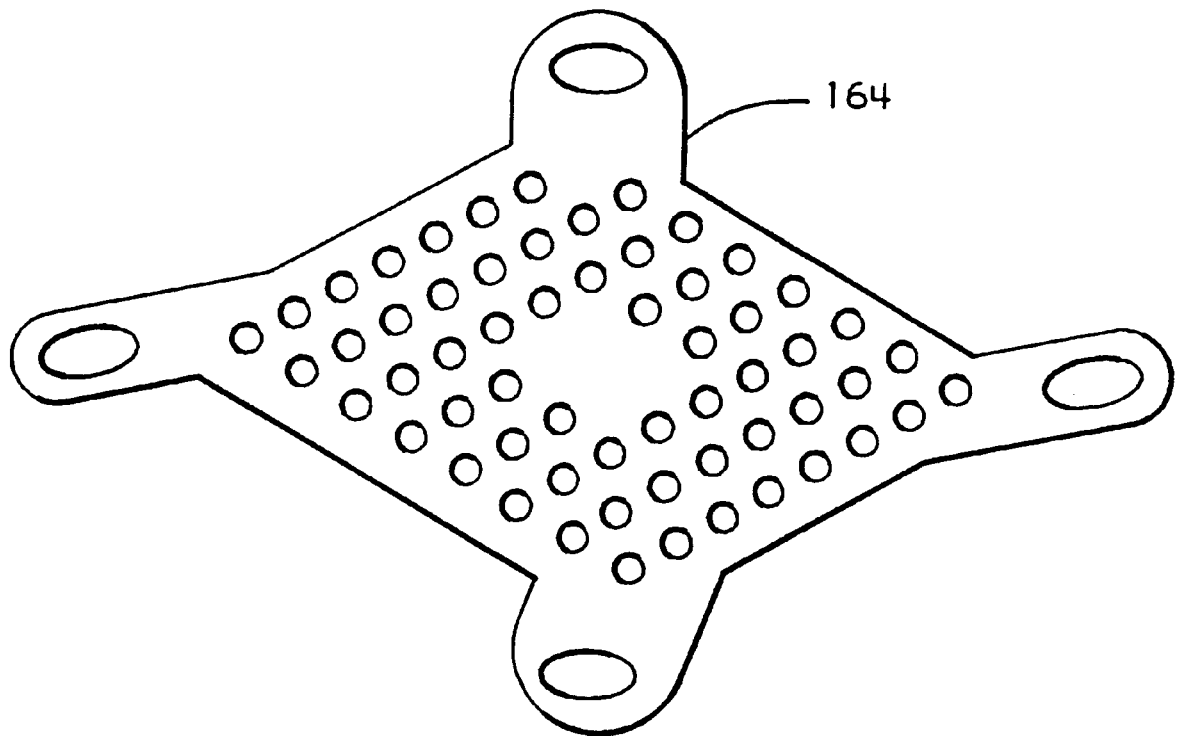
FIG. 5 is a perspective view of an anisotropic electrically conductive interposer.

In the embodiment of the interposer of FIG. 5, the interposer extends between the substrate 108 in FIG. 3 and the base 352 in FIG. 18. Alternately, as shown in FIG. 4, the interposer may be mounted within central area of the base frame before placing the component.

Figure 21:
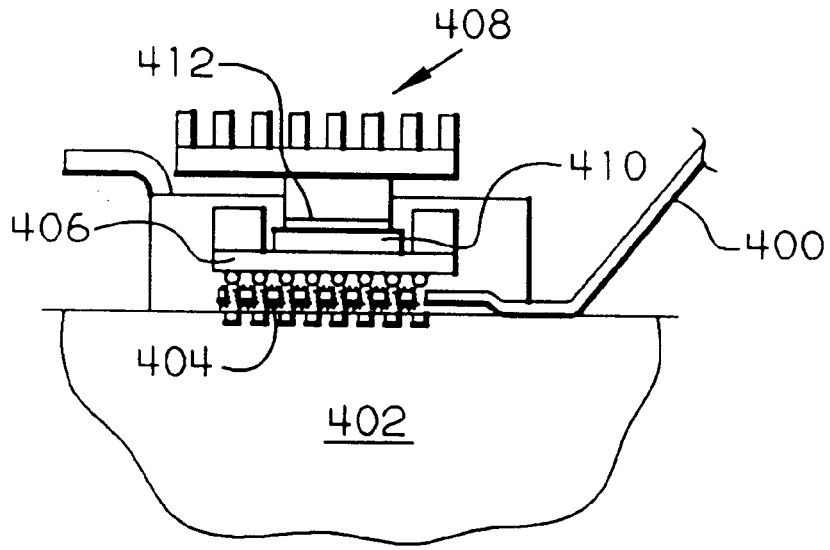
FIG. 21 is a cross-sectional view of a area array socket assembly with heatsink and breakout cable.

In FIG. 21 in a take-out arrangement, a flexible circuit board 400 is connected to a rigid circuit board 402 such as a FR-4 circuit board. An interposer 404 extends between corresponding area contacts arrays of the flexible circuit board and the rigid circuit board. A component 406 is connected to the opposite side of the flexible circuit board from the rigid circuit board. A heat sink structure 408 is connected to an exposed flip chip 410 of the component by solder or adhesive material 412. This arrangement is especially useful for connecting flexible circuit boards to rigid circuit boards for operational testing of such components.

Figure 22:
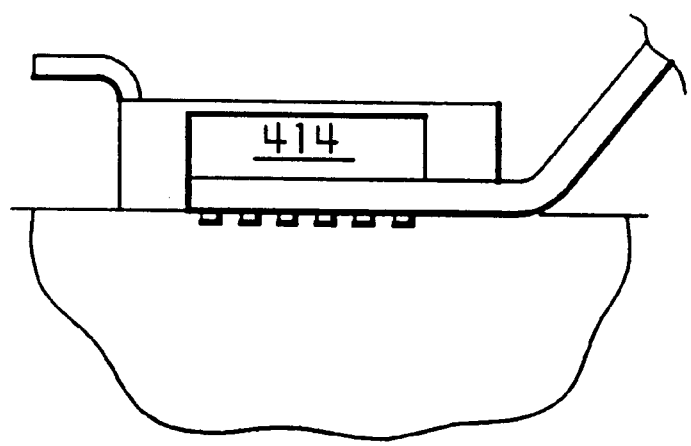
FIG. 22 is a side view depicting breakout flex application.

FIG. 22 is similar to FIG. 21, but no interposer or component is included. The pressure distribution member 414 would be thicker to compensate. Preferably the contacts of the flexible circuit board or rigid circuit board would be plated with dendrites and the corresponding contacts on the other board would preferably be covered with a soft conductive material such as gold or Pb/Sn solder.

We claim:

1. A socket for providing relatively easy replacement of an area array component of an interconnect structure having an area array site and positioned on a substrate, said socket comprising:

a base positioned on a substrate adjacent said area array site of said interconnect structure;

a spring member hingedly positioned on said base and having a first and a second end, and a central member positioned at said first end and including first and second spring arm members projecting therefrom;

a pressure distribution member for distributing pressure onto said area array component, said first and second spring arm members of said spring member engaging said pressure distribution member to bias said area array component toward said area array site of said interconnect structure;

a torsion arresting member for preventing twisting of said first and second spring arm members projecting from said central member; and a coupler for selectively mechanically holding down said second end of said spring member, said coupler adapted for being selectively uncoupled to allow replacing of said area array component, thereby reusing said base and said spring member.

2. The socket of claim 1 further including an electrically conductive interposer positioned substantially across said area array site of said interconnect structure.

3. The socket of claim 2 wherein said electrically conductive interposer is reusable.

4. The socket of claim 3 wherein said electrically conductive interposer comprises a film of dendrite filled organic material.

5. The socket of claim 1 further including a third spring arm member.

6. The socket of claim 1 further including a spring clip for clipping a heat sink associated with said area array component onto said component, said spring clip engaging said spring member.

* * * * *